United States Patent
Mathew et al.

(10) Patent No.: US 9,515,131 B2
(45) Date of Patent: *Dec. 6, 2016

(54) NARROW BORDER ORGANIC LIGHT-EMITTING DIODE DISPLAY

(71) Applicant: Apple Inc., Cupertino, CA (US)

(72) Inventors: Dinesh C. Mathew, Fremont, CA (US); Adam T. Garelli, Santa Clara, CA (US); Paul S. Drzaic, Morgan Hill, CA (US); Wei Chen, Palo Alto, CA (US); Brett W. Degner, Menlo Park, CA (US); Bryan W. Posner, La Selva Beach, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/948,157

(22) Filed: Nov. 20, 2015

(65) Prior Publication Data
US 2016/0079337 A1 Mar. 17, 2016

Related U.S. Application Data

(63) Continuation of application No. 13/588,831, filed on Aug. 17, 2012, now Pat. No. 9,214,507.

(51) Int. Cl.
*H01J 1/62* (2006.01)
*H01L 27/32* (2006.01)
(Continued)

(52) U.S. Cl.
CPC .......... *H01L 27/3276* (2013.01); *G06F 3/041* (2013.01); *H01L 51/0097* (2013.01);
(Continued)

(58) Field of Classification Search
CPC . G06F 3/0412; H01L 27/3276; H01L 51/5293
(Continued)

(56) References Cited

U.S. PATENT DOCUMENTS 2,933,655 A 4/1960 Gradisar et al.
4,066,855 A 1/1978 Zenk
(Continued)

FOREIGN PATENT DOCUMENTS

CN 101106157 1/2008
CN 101430473 5/2009
(Continued)

OTHER PUBLICATIONS

US 9,224,326, 12/2015, Wright et al. (withdrawn)

*Primary Examiner* — Vip Patel
(74) *Attorney, Agent, or Firm* — Treyz Law Group, P.C.; G. Victor Treyz; Zachary D. Hadd (57) ABSTRACT

An electronic device may be provided having an organic light-emitting diode display and control circuitry for operating the display. The display may include one or more display layers interposed between the control circuitry and a display layer having thin-film transistors. The electronic device may include a coupling structure interposed between the layer of thin-film transistors and the control circuitry that electrically couples the layer of thin-film transistors to the control circuitry. The coupling structure may include a dielectric member having a conductive via, a flexible printed circuit having a bent portion, or a conductive via formed in an encapsulation layer of the display. The display may include a layer of opaque masking material. The layer of opaque masking material may be formed on an encapsulation layer, an organic emissive layer, a thin-film transistor layer, or a glass layer of the organic light-emitting diode display.

20 Claims, 9 Drawing Sheets

(51) Int. Cl.
*G06F 3/041* (2006.01)
*H05B 33/08* (2006.01)
*H01L 51/00* (2006.01)
*H01L 51/52* (2006.01)

(52) U.S. Cl.
CPC ...... *H01L 51/5284* (2013.01); *H01L 51/5293* (2013.01); *H05B 33/0896* (2013.01); *G06F 3/0412* (2013.01); *H01L 51/5281* (2013.01); *H03K 2217/96031* (2013.01)

(58) Field of Classification Search
USPC .............................. 313/506, 498, 504, 512
See application file for complete search history.

(56) References Cited

U.S. PATENT DOCUMENTS

| | | |
|---|---|---|
| 4,085,302 A | 4/1978 | Zenk et al. |
| 4,487,993 A | 12/1984 | Becker |
| 5,235,451 A | 8/1993 | Bryan |
| 5,276,382 A | 1/1994 | Stocker et al. |
| 5,436,744 A | 7/1995 | Arledge et al. |
| 5,483,261 A | 1/1996 | Yasutake |
| 5,488,204 A | 1/1996 | Mead et al. |
| 5,493,096 A | 2/1996 | Koh |
| 5,577,205 A | 11/1996 | Hwang et al. |
| 5,825,352 A | 10/1998 | Bisset et al. |
| 5,835,079 A | 11/1998 | Shieh |
| 5,844,781 A | 12/1998 | Schlotter et al. |
| 5,880,411 A | 3/1999 | Gillespie et al. |
| 5,880,705 A | 3/1999 | Onyskevych et al. |
| 6,091,194 A | 7/2000 | Swirbel et al. |
| 6,188,391 B1 | 2/2001 | Seely et al. |
| 6,191,435 B1 | 2/2001 | Inoue |
| 6,239,982 B1 | 5/2001 | Bozzer et al. |
| 6,310,610 B1 | 10/2001 | Beaton et al. |
| 6,323,846 B1 | 11/2001 | Westerman et al. |
| 6,421,033 B1 | 7/2002 | Williams et al. |
| 6,498,592 B1 | 12/2002 | Matthies |
| 6,560,117 B2 | 5/2003 | Moon |
| 6,617,177 B1 | 9/2003 | Winer |
| 6,690,387 B2 | 2/2004 | Zimmerman et al. |
| 6,738,263 B2 | 5/2004 | Corisis et al. |
| 6,774,872 B1 | 8/2004 | Kawada et al. |
| 6,801,174 B2 | 10/2004 | Kayama et al. |
| 6,815,835 B2 | 11/2004 | James |
| 7,015,894 B2 | 3/2006 | Morohoshi |
| 7,184,064 B2 | 2/2007 | Zimmerman et al. |
| 7,211,738 B2 | 5/2007 | Lee et al. |
| 7,245,500 B2 | 7/2007 | Khan et al. |
| 7,342,354 B2 | 3/2008 | Utsunomiay et al. |
| 7,417,867 B1 | 8/2008 | Matsuda et al. |
| 7,663,607 B2 | 2/2010 | Hotelling et al. |
| 7,791,700 B2 | 9/2010 | Bellamy |
| 7,796,397 B2 | 9/2010 | Yamauchi et al. |
| 7,816,721 B2 | 10/2010 | Yamazaki et al. |
| 7,864,136 B2 | 1/2011 | Matthies et al. |
| 7,977,170 B2 | 7/2011 | Tredwell et al. |
| 8,148,259 B2 | 4/2012 | Arai et al. |
| 8,169,588 B2 | 5/2012 | Oikawa et al. |
| 8,194,222 B2 | 6/2012 | Seki et al. |
| 8,258,523 B2 | 9/2012 | Lee et al. |
| 8,269,923 B2 | 9/2012 | Yamagishi et al. |
| 8,362,488 B2 | 1/2013 | Chaug et al. |
| 8,395,722 B2 | 3/2013 | Mathew et al. |
| 8,456,586 B2 | 6/2013 | Mathew et al. |
| 8,466,852 B2 | 6/2013 | Drzaic et al. |
| 8,766,858 B2 | 7/2014 | Li et al. |
| 8,767,141 B2 | 7/2014 | Mathew et al. |
| 8,804,347 B2 | 8/2014 | Martisauskas |
| 9,226,347 B2 | 12/2015 | Weber et al. |
| 2001/0015788 A1 | 8/2001 | Mandal et al. |
| 2002/0085158 A1 | 7/2002 | Armagost et al. |
| 2002/0088986 A1 | 7/2002 | Kayama et al. |
| 2003/0011298 A1 | 1/2003 | Palanisamy |
| 2003/0206331 A1 | 11/2003 | Chung et al. |
| 2004/0016568 A1 | 1/2004 | Palanisamy |
| 2004/0263947 A1 | 12/2004 | Drzaic et al. |
| 2005/0072597 A1 | 4/2005 | Lee et al. |
| 2006/0026521 A1 | 2/2006 | Hotelling et al. |
| 2006/0026536 A1 | 2/2006 | Hotelling et al. |
| 2006/0197753 A1 | 9/2006 | Hotelling |
| 2007/0002009 A1 | 1/2007 | Pasch et al. |
| 2007/0019147 A1 | 1/2007 | Ryu |
| 2007/0035679 A1 | 2/2007 | Lee et al. |
| 2007/0063939 A1 | 3/2007 | Bellamy |
| 2007/0080360 A1 | 4/2007 | Mirsky et al. |
| 2007/0148831 A1 | 6/2007 | Nagata et al. |
| 2008/0010876 A1 | 1/2008 | Sung et al. |
| 2008/0024060 A1 | 1/2008 | Jonnalagadda et al. |
| 2008/0042180 A1 | 2/2008 | Yamazaki et al. |
| 2008/0049408 A1 | 2/2008 | Yamauchi et al. |
| 2008/0143913 A1 | 6/2008 | Lee et al. |
| 2009/0027896 A1 | 1/2009 | Nishimura et al. |
| 2009/0122653 A1 | 5/2009 | Seki |
| 2009/0191670 A1 | 7/2009 | Heitzinger et al. |
| 2009/0278452 A1 | 11/2009 | Kim |
| 2009/0284688 A1 | 11/2009 | Shiraishi et al. |
| 2010/0148209 A1 | 6/2010 | Hatano et al. |
| 2010/0265225 A1 | 10/2010 | Han et al. |
| 2010/0315570 A1 | 12/2010 | Mathew et al. |
| 2011/0012845 A1 | 1/2011 | Rothkopf et al. |
| 2011/0101314 A1 | 5/2011 | Kim |
| 2011/0109829 A1 | 5/2011 | Mathew et al. |
| 2011/0176199 A1 | 7/2011 | Sakurai |
| 2011/0186345 A1 | 8/2011 | Pakula et al. |
| 2011/0194063 A1 | 8/2011 | Lee et al. |
| 2011/0204403 A1 | 8/2011 | Kim et al. |
| 2012/0009973 A1 | 1/2012 | Demuynck et al. |
| 2012/0218502 A1 | 8/2012 | Seki |
| 2012/0235969 A1 | 9/2012 | Burns et al. |
| 2012/0242592 A1 | 9/2012 | Rothkopf et al. |
| 2012/0319304 A1 | 12/2012 | Pressel et al. |
| 2013/0002685 A1 | 1/2013 | Shenoy et al. |
| 2013/0082984 A1 | 4/2013 | Drzaic et al. |
| 2013/0088671 A1 | 4/2013 | Drzaic et al. |
| 2013/0094126 A1 | 4/2013 | Rappoport et al. |
| 2013/0107476 A1 | 5/2013 | Wright et al. |
| 2013/0328051 A1 | 12/2013 | Franklin et al. |
| 2013/0342099 A1 | 12/2013 | Weber et al. |
| 2014/0049522 A1 | 2/2014 | Mathew et al. |
| 2014/0063393 A1 | 3/2014 | Zhong et al. |
| 2014/0254094 A1 | 9/2014 | Chang et al. |
| 2014/0265822 A1 | 9/2014 | Drzaic |

FOREIGN PATENT DOCUMENTS

| | | |
|---|---|---|
| CN | 102187272 | 9/2011 |
| CN | 102437405 | 5/2012 |
| EP | 0474508 | 3/1992 |
| EP | 2138892 | 3/2002 |
| EP | 2141573 | 6/2010 |
| EP | 2418537 | 2/2012 |
| JP | 10-261854 | 9/1998 |
| JP | 2000163031 | 6/2000 |
| JP | 2001-092381 | 4/2001 |
| JP | 2002-040472 | 2/2002 |
| JP | 200293851 | 3/2002 |
| JP | 2002341785 | 11/2002 |
| JP | 2002342033 | 11/2002 |
| JP | H05-142556 | 11/2002 |
| JP | 2003058074 | 2/2003 |
| JP | 2003-255850 | 9/2003 |
| JP | 2003-337353 | 11/2003 |
| JP | 3593975 | 11/2004 |
| JP | 200549685 | 2/2005 |
| JP | 2007220569 | 8/2007 |
| JP | 2008-033094 | 2/2008 |
| JP | 2009098451 | 5/2009 |
| JP | 2009-244338 | 10/2009 |
| JP | 2009229754 | 10/2009 |
| JP | 2010039211 | 2/2010 |
| JP | 2011042531 | 3/2011 |
| KR | 10-2005-0093595 | 9/2005 |

(56) References Cited

FOREIGN PATENT DOCUMENTS

| | | |
|---|---|---|
| KR | 10-2010-005021 | 1/2010 |
| KR | 10-2011-0059629 | 6/2011 |
| KR | 10-2012-0020088 | 3/2012 |
| TW | 200521587 | 7/2005 |
| TW | I247835 | 1/2006 |
| TW | 200839356 | 10/2008 |
| TW | 201224716 A | 6/2012 |
| WO | 2006106365 | 10/2006 |
| WO | 2008114404 | 9/2008 |
| WO | 2009089105 | 7/2009 |

NARROW BORDER ORGANIC LIGHT-EMITTING DIODE DISPLAY

This application is a continuation of U.S. patent application Ser. No. 13/588,831, filed Aug. 17, 2012, which is hereby incorporated by reference herein in its entirety. This application claims the benefit of and claims priority to U.S. patent application Ser. No. 13/588,831, filed Aug. 17, 2012.

BACKGROUND

This relates generally to electronic devices, and more particularly, to electronic devices with displays.

Electronic devices often include displays. For example, cellular telephones and portable computers often include displays for presenting information to a user. An electronic device may have a housing such as a housing formed from plastic or metal. Components for the electronic device such as display components may be mounted in the housing.

It can be challenging to incorporate a display into the housing of an electronic device. Size and weight are often important considerations in designing electronic devices. If care is not taken, displays may be bulky or may be surrounded by overly large borders. The housing of an electronic device can be adjusted to accommodate a bulky display with large borders, but this can lead to undesirable enlargement of the size and weight of the housing and unappealing device aesthetics.

It would therefore be desirable to be able to provide improved ways to provide displays for electronic devices.

SUMMARY

An electronic device may be provided with an organic light-emitting diode display. The display may include an organic light-emitting diode layer that includes an array of thin-film transistors and a layer of organic light-emitting material.

The electronic device may include control circuitry that generates control signals for operating the organic light-emitting diode display. The display may include at least one display layer interposed between the array of thin-film transistors and the control circuitry. The electronic device may include one or more coupling structures that electrically couple the array of thin-film transistors to the control circuitry.

The coupling structures may include a dielectric member that includes a conductive via interposed between a portion of the array of thin-film transistors and the control circuitry.

The control circuitry may include a flexible printed circuit attached to a printed circuit board and, if desired, a display driver integrated circuit attached to the printed circuit board.

The layer of organic light-emitting material and an encapsulation layer that covers the layer of organic light-emitting material may be interposed between the array of thin-film transistors and the control circuitry.

The coupling member may include a flexible printed circuit having a bent portion or may include a conductive via in the encapsulation layer that extends from a first surface of the encapsulation layer to a second surface of the encapsulation layer.

The display may include an organic light-emitting diode layer having opposing first and second surfaces, an encapsulation layer formed on the first surface, and a substrate layer such as a polyimide layer formed on the second surface. A conductive via may be provided in the substrate layer that couples the organic light-emitting diode layer to the control circuitry.

The display may include an active area for displaying images and an inactive area and layer of opaque masking material formed on a display layer in the inactive area. The opaque masking material may be interposed between a portion of the encapsulation layer and a portion of the organic light-emitting diode layer, may be formed between a light-polarizing layer for the and the encapsulation layer, or may be formed on the layer of thin-film transistor circuitry.

The display may include a transparent substrate layer such as a glass layer having opposing first and second surfaces, the organic light-emitting diode layer may be formed on the first surface, a light-polarizing layer may be formed on the second surface, and the opaque masking material may be interposed between a portion of the transparent substrate layer and a portion of the light-polarizing layer.

Further features of the invention, its nature and various advantages will be more apparent from the accompanying drawings and the following detailed description of the preferred embodiments.

DETAILED DESCRIPTION

Electronic devices may include displays. The displays may be used to display images to a user. Illustrative electronic devices that may be provided with displays are shown in FIGS. 1, 2, and 3.

Figure 1:
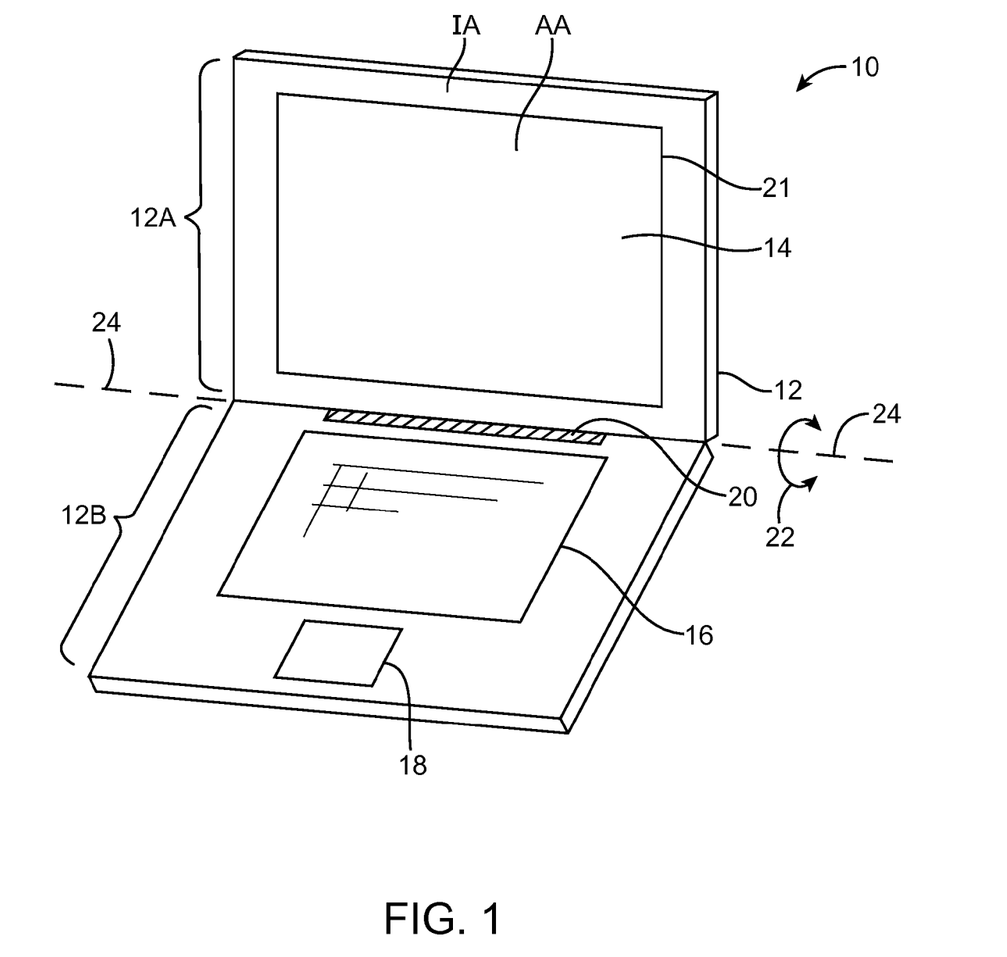
FIG. 1 is a perspective view of an illustrative electronic device such as a laptop computer with a display in accordance with an embodiment of the present invention.

FIG. 1 shows how electronic device 10 may have the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lower housing 12B. Display 14 may be mounted in upper housing 12A. Upper housing 12A, which may sometimes referred to as a display housing or lid, may be placed in a closed position by rotating upper housing 12A towards lower housing 12B about rotational axis 24.

Figure 2:
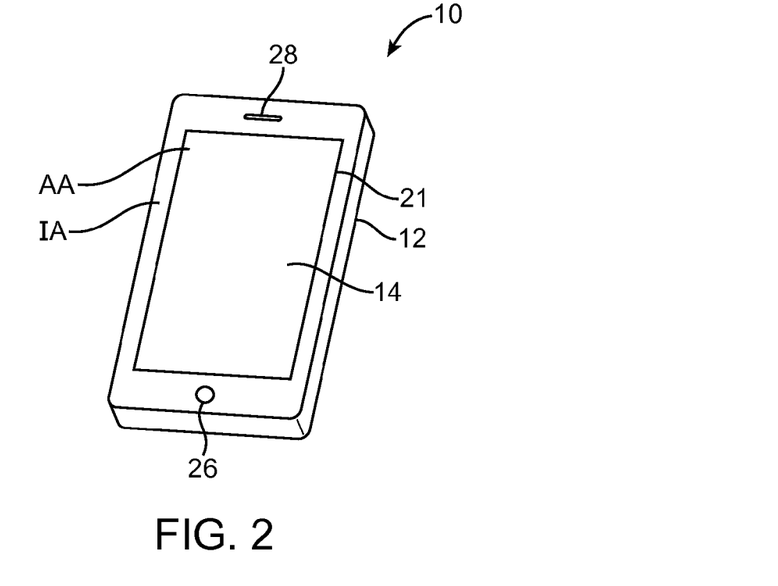
FIG. 2 is a perspective view of an illustrative electronic device such as a handheld electronic device with a display in accordance with an embodiment of the present invention.

FIG. 2 shows how electronic device 10 may be a handheld device such as a cellular telephone, music player, gaming device, navigation unit, or other compact device. In this type of configuration for device 10, housing 12 may have opposing front and rear surfaces. Display 14 may be mounted on a front face of housing 12. Display 14 may, if desired, have a display cover layer or other exterior layer that includes openings for components such as button 26. Openings may also be formed in a display cover layer or other display layer to accommodate a speaker port (see, e.g., speaker port 28 of FIG. 2).

Figure 3:
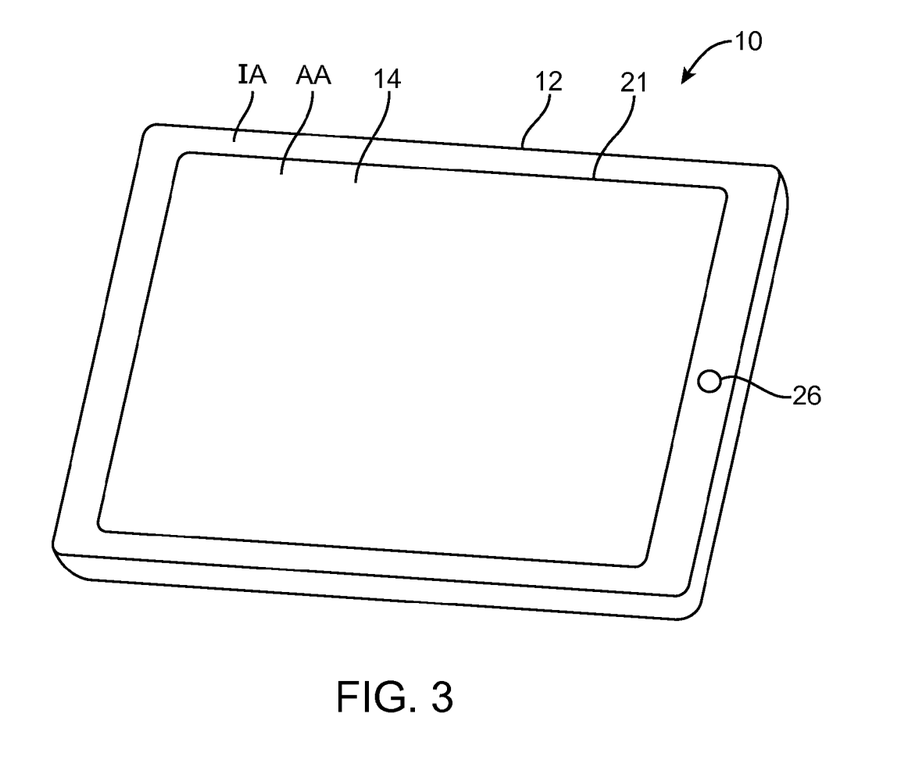
FIG. 3 is a perspective view of an illustrative electronic device such as a tablet computer with a display in accordance with an embodiment of the present invention.

FIG. 3 shows how electronic device 10 may be a tablet computer. In electronic device 10 of FIG. 3, housing 12 may have opposing planar front and rear surfaces. Display 14 may be mounted on the front surface of housing 12. As shown in FIG. 3, display 14 may have a cover layer or other external layer with an opening to accommodate button 26 (as an example).

Peripheral portions of display 14 may be provided with an opaque masking layer. As shown in FIGS. 1, 2, and 3, display 14 may be characterized by a central active region such as active region AA in which an array of display pixels is used in displaying information for a user. Active region AA may be surrounded by an inactive region such as inactive border region IA. Active region AA may have a rectangular shape bordered by rectangular line 21. Inactive region IA may have a rectangular ring shape that surrounds active region AA (as an example). Portions of display 14 in inactive region IA may be covered with an opaque masking material such as a layer of black ink (e.g., a polymer filled with carbon black) or a layer of opaque metal. The opaque masking layer may help hide components in the interior of device 10 in inactive region IA from view by a user.

The illustrative configurations for device 10 that are shown in FIGS. 1, 2, and 3 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Displays for device 10 may, in general, include image pixels formed from light-emitting diodes (LEDs), organic LEDs (OLEDs), plasma cells, electrowetting pixels, electrophoretic pixels, liquid crystal display (LCD) components, or other suitable image pixel structures. In some situations, it may be desirable to use OLED components to form display 14, so configurations for display 14 in which display 14 is an organic light-emitting diode display are sometimes described herein as an example. Other types of display technology may be used in device 10 if desired.

A display cover layer may cover the surface of display 14 or a display layer such as a color filter layer or other portion of a display may be used as the outermost (or nearly outermost) layer in display 14. A display cover layer or other outer display layer may be formed from a transparent glass sheet, a clear plastic layer, or other transparent member.

Touch sensor components such as an array of capacitive touch sensor electrodes formed from transparent materials such as indium tin oxide may be formed on the underside of a display cover layer, may be formed on a separate display layer such as a glass or polymer touch sensor substrate, or may be integrated into other display layers (e.g., substrate layers such as a thin-film transistor layer).

Figure 4:
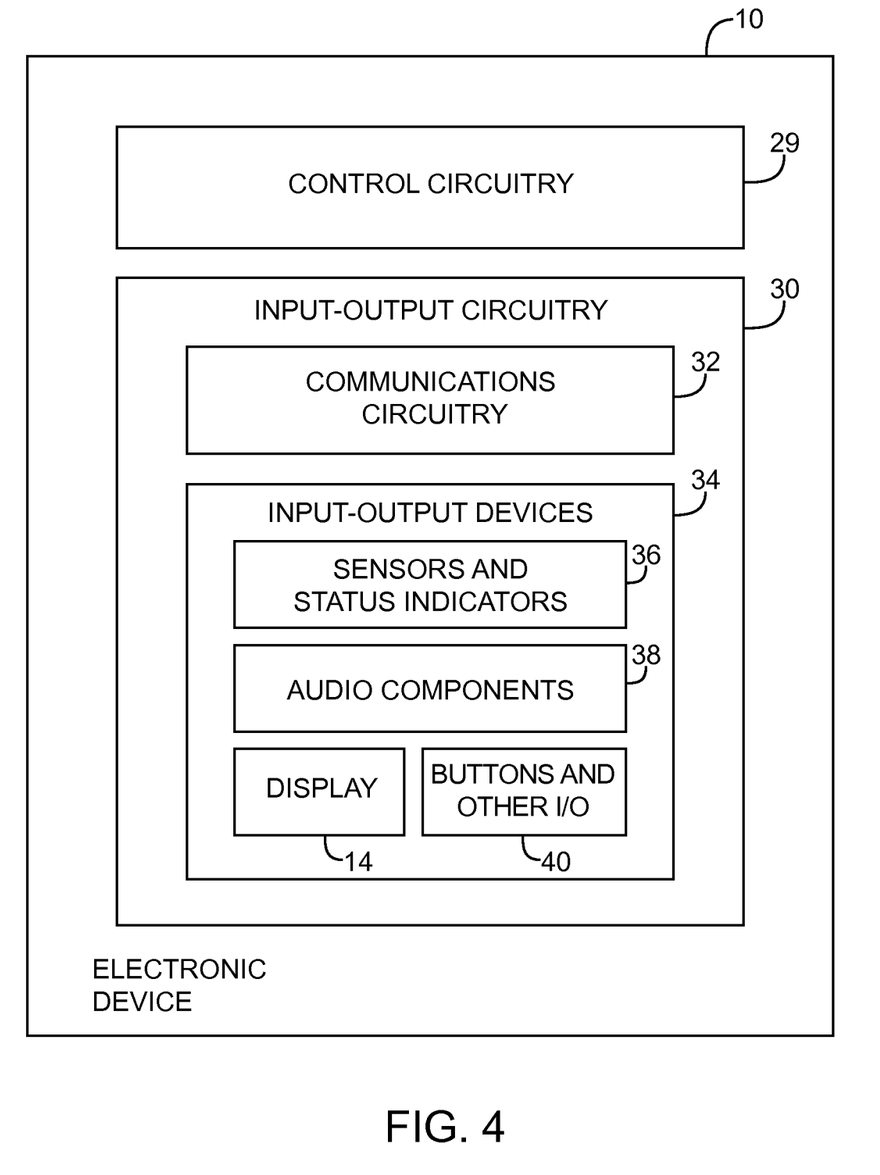
FIG. 4 is a schematic diagram of an illustrative electronic device with a display in accordance with an embodiment of the present invention.

A schematic diagram of an illustrative configuration that may be used for electronic device 10 is shown in FIG. 4. As shown in FIG. 4, electronic device 10 may include control circuitry 29. Control circuitry 29 may include storage and processing circuitry for controlling the operation of device 10. Control circuitry 29 may, for example, include storage such as hard disk drive storage, nonvolatile memory (e.g., flash memory or other electrically-programmable-read-only memory configured to form a solid state drive), volatile memory (e.g., static or dynamic random-access-memory), etc. Control circuitry 29 may include processing circuitry based on one or more microprocessors, microcontrollers, digital signal processors, baseband processors, power management units, audio codec chips, application specific integrated circuits, etc.

Control circuitry 29 may be used to run software on device 10, such as operating system software and application software. Using this software, control circuitry 29 may present information to a user of electronic device 10 on display 14. When presenting information to a user on display 14, sensor signals and other information may be used by control circuitry 29 in making adjustments to the strength of OLED illumination that is used for display 14.

Input-output circuitry 30 may be used to allow data to be supplied to device 10 and to allow data to be provided from device 10 to external devices. Input-output circuitry 30 may include communications circuitry 32. Communications circuitry 32 may include wired communications circuitry for supporting communications using data ports in device 10. Communications circuitry 32 may also include wireless communications circuits (e.g., circuitry for transmitting and receiving wireless radio-frequency signals using antennas).

Input-output circuitry 30 may also include input-output devices 34. A user can control the operation of device 10 by supplying commands through input-output devices 34 and may receive status information and other output from device 10 using the output resources of input-output devices 34.

Input-output devices 34 may include sensors and status indicators 36 such as an ambient light sensor, a proximity sensor, a temperature sensor, a pressure sensor, a magnetic sensor, an accelerometer, and light-emitting diodes and other components for gathering information about the environment in which device 10 is operating and providing information to a user of device 10 about the status of device 10.

Audio components 38 may include speakers and tone generators for presenting sound to a user of device 10 and microphones for gathering user audio input.

Display 14 may be used to present images for a user such as text, video, and still images. Sensors 36 may include a touch sensor array that is formed as one of the layers in display 14.

User input may be gathered using buttons and other input-output components 40 such as touch pad sensors, buttons, joysticks, click wheels, scrolling wheels, touch sensors such as sensors 36 in display 14, key pads, keyboards, vibrators, cameras, and other input-output components.

Figure 5A:
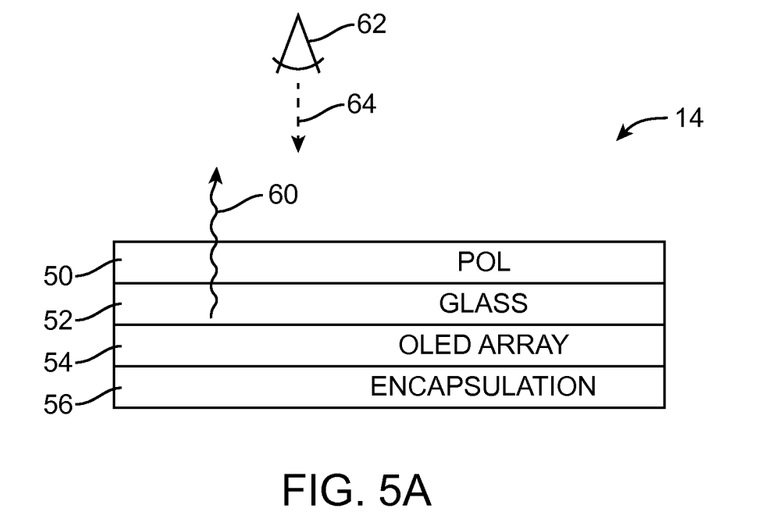
FIG. 5A is a cross-sectional side view of an illustrative bottom emission organic light-emitting diode display in accordance with an embodiment of the present invention.
Figure 5B:
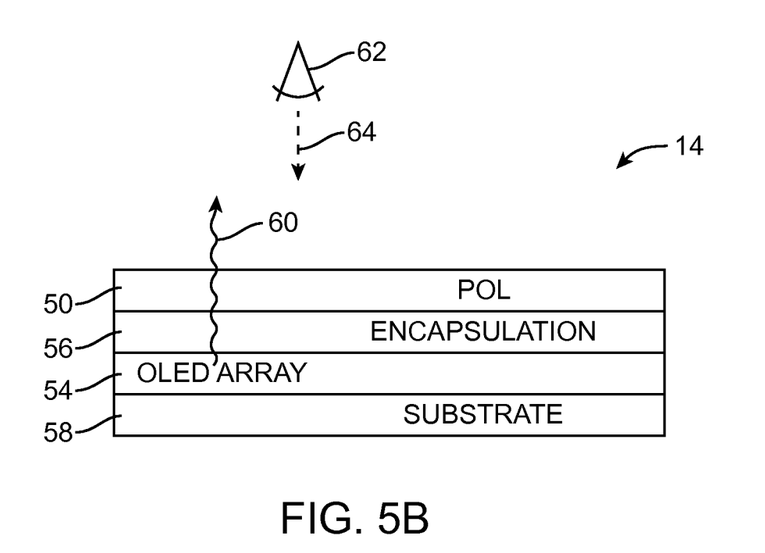
FIG. 5B is a cross-sectional side view of a top emission organic light-emitting diode display accordance with an embodiment of the present invention.

Cross-sectional side views of configurations that may be used for display 14 of device 10 (e.g., for display 14 of the devices of FIG. 1, FIG. 2, or FIG. 3 or other suitable electronic devices) is shown in FIGS. 5A and 5B. FIG. 5A is a cross-sectional side view of an illustrative bottom emission organic light-emitting diode display. FIG. 5B is a cross-sectional side view of an illustrative top emission organic light-emitting diode display.

In a configuration for display 14 of the type shown in FIG. 5A, display 14 may have a transparent substrate layer such as glass layer 52. A layer of organic light-emitting diode structures such as organic light-emitting diode layer 54 may be formed on the underside of glass layer 52. An encapsulation layer such as encapsulation layer 56 may be used to encapsulate organic light-emitting diode layer 54. Encapsulation layer 56 may be formed from a layer of metal foil, metal foil covered with plastic, other metal structures, a glass layer, a thin-film encapsulation layer formed from a material such as silicon nitride, a layered stack of alternating polymer and ceramic materials, or other suitable material for encapsulating organic light-emitting diode layer 54. Encapsulation layer 56 may be used to protect organic light-emitting diode layer 54 from environmental exposure by preventing water and oxygen from reaching organic emissive materials within organic light-emitting diode layer 54.

Organic light-emitting diode layer 54 may contain an array of thin-film transistors. The thin-film transistors may be formed from semiconductors such as amorphous silicon, polysilicon, or compound semiconductors (as examples). Signal lines (e.g., a grid of horizontal and vertical metal lines) may be used in applying control signals to the array of thin-film transistors. During operation, signals may be applied to the organic light-emitting diodes in layer 54 using the signal lines so that an image may be created on display 14. Image light 60 from the organic light-emitting diode pixels in layer 54 may be emitted upwards through transparent glass layer 52 for viewing in direction 64 by viewer 62. Circular polarizer 50 may suppress reflections from the metal signal lines in layer 54 that might otherwise be visible to viewer 62.

In a configuration for display 14 of the type shown in FIG. 5B, display 14 may have a substrate layer such as substrate layer 58. Substrate layer 58 may be a polyimide layer that is temporarily carried on a glass carrier during manufacturing or may be a layer formed from glass or other suitable substrate materials.

Organic light-emitting diode layer 54 may be formed on the upper surface of substrate 58. An encapsulation layer such as encapsulation layer 56 may be used to encapsulate organic light-emitting diode layer 54. During operation, individually controlled pixels in organic light-emitting diode layer 54 may be used to generate image light 60 for viewing in direction 64 by viewer 62. Circular polarizer 50 may suppress reflections from metal signal lines in layer 54. If desired an array of color filter elements may be included in polarizer layer 50.

Figure 6:
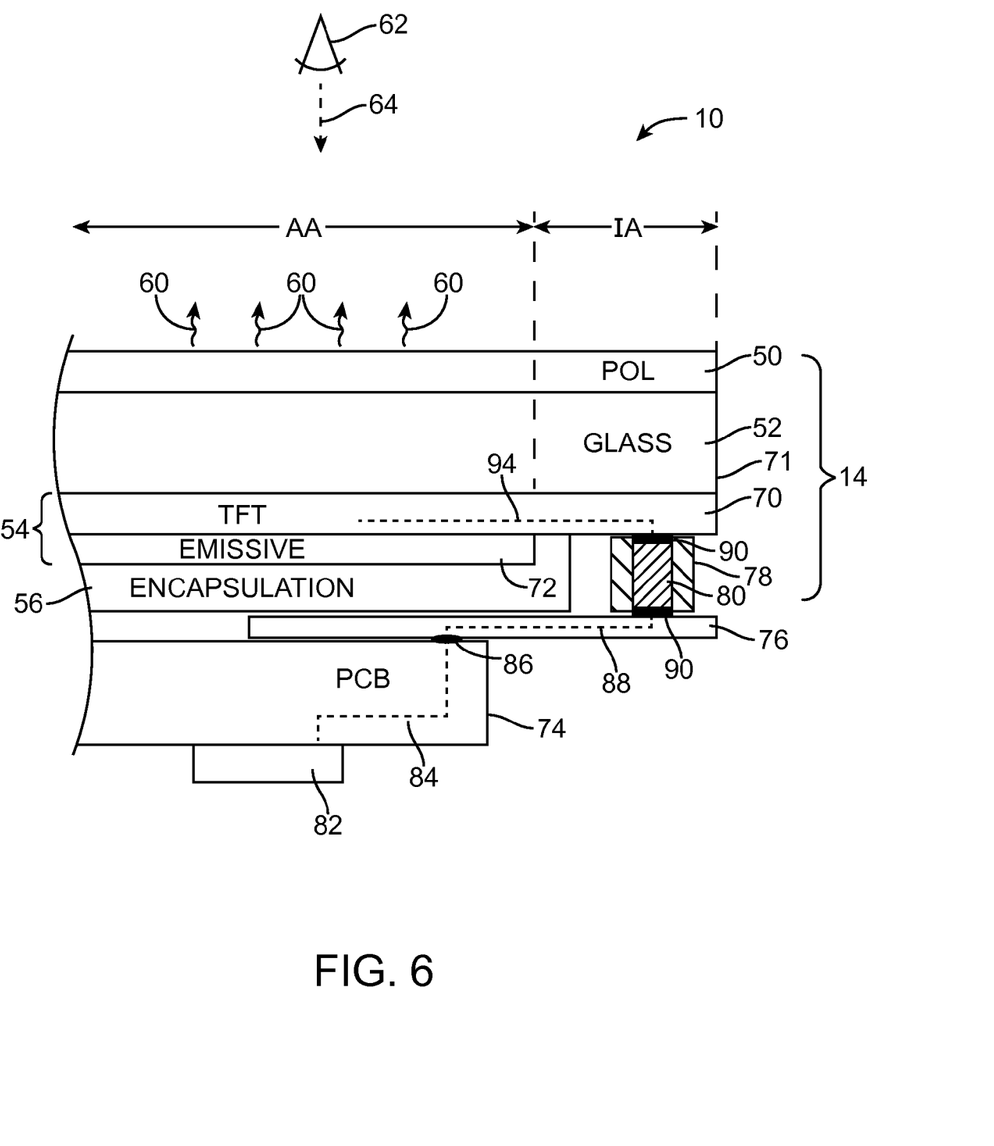
FIG. 6 is a cross-sectional side view of a portion of an illustrative display having an organic light-emitting diode array and a gap-filling member in accordance with an embodiment of the present invention.

FIG. 6 is a cross-sectional side view of a bottom-emissive organic light-emitting diode display of the type shown in FIG. 5A showing how the size of inactive area IA may be minimized by forming control circuitry such as control circuitry 28 (FIG. 4) for the display behind a portion of the display. As shown in FIG. 6, control circuitry 28 may include component 82 and printed circuit 74 that are coupled to display 14. Printed circuit 74 may, for example, be a printed circuit board. Printed circuit 74 may be a dedicated printed circuit for controlling operation of display 14 or may be a printed circuit board such as a mother board that is used in controlling multiple components within device 10.

As shown in FIG. 6, control circuitry for display (e.g., printed circuit 74 and component 82) may be formed behind display 14 so that the control circuitry is not visible to a viewer such as viewer 62 viewing display 14 in direction 64 and without extending beyond edge 71 of display 14. In this way, the size of inactive area IA may be reduced in comparison with conventional displays in which a display driver integrated circuit is formed along the edge of the display.

Component 82 may, for example, be a display driver integrated circuit that is used to generate control signals to be conveyed to thin-film transistors in thin-film-transistor layer 70 of OLED layer 54. Printed circuit 74 and/or component 82 may be used to generate information to be displayed on display 14 (e.g., display data). The information to be displayed may be conveyed from control circuitry such as printed circuit 74 to thin-film-transistors in layer 70 using a signal path such as a signal path 88 formed from conductive metal traces in printed circuit 76 (as an example).

Printed circuit 76 may, for example be a flexible printed circuit (e.g., a flexible printed circuit cable). Printed circuit 76 may be used in routing signals between printed circuit 74 and thin-film-transistor layer 70. If desired, display driver integrated circuit 82 may be mounted on printed circuit 74 or flexible printed circuit 76. Printed circuit 74 may be formed from a rigid printed circuit board (e.g., a layer of fiberglass-filled epoxy) or a flexible printed circuit (e.g., a flexible sheet of polyimide). Printed circuit 76 may be formed from a rigid printed circuit board (e.g., a layer of fiberglass-filled epoxy) or a flexible printed circuit (e.g., a flexible sheet of polyimide). In one suitable example that is sometimes described herein, printed circuit 76 is implemented as a flexible printed circuit.

Signal path 88 may be coupled to signal path 84 in printed circuit board 74 using conductive contact 86. Conductive contact 86 may be formed from a conductive adhesive, solder, or other suitable conductive structures or materials.

Organic-light-emitting diode layer 54 may include thin-film transistor (TFT) layer 70 and a layer of organic light-emitting material such as emissive layer 72. TFT layer 70 may include an array of thin-film transistors. The thin-film transistors may be formed from semiconductors such as amorphous silicon, polysilicon, or compound semiconductors (as examples). Organic emissive layer 72 may be formed from organic plastics such as polyfluorene or other organic emissive materials. Encapsulation layer 56 may cover emissive layer 72 and, if desired, some or all of TFT layer 70.

Signal lines 94 (e.g., a grid of horizontal and vertical metal lines) may be used in applying control signals to the array of thin-film transistors in TFT layer 70. Signals applied to the thin-film transistors in TFT layer 70 may selectively cause portions of emissive layer 72 to emit display light such as light 66. In this way, images may be created on display 14.

Thin-film transistors in TFT layer 70 may be formed in active area AA. Signal lines 94 may be used to route signals received from printed circuit 74 in inactive area IA to the thin-film transistors in TFT layer 70. However, in some situations, emissive layer 72 and encapsulation layer 56 may form a gap between flexible printed circuit 76 and TFT layer 70. In order to couple signal lines 94 in TFT layer 70 to signal lines 88 in printed circuit 76, a dielectric spacer such as gap-filling member 78 may be provided that has a conductive via such as via 80.

Conductive via 80 in spacer 78 may be used to route signals to TFT layer 70 from printed circuit 76 (or from other components such as integrated circuit 82). Conductive contacts 90 (e.g., contacts formed from conductive adhesive, anisotropic conductive adhesive, solder, etc.) may be used to couple via 80 to conductive contacts on flexible printed circuit 76 and TFT layer 70.

Gap-filling member 78 may be formed from a polymer material or other dielectric material in which a conductive via can be formed. Via 80 may be formed in member 78 by forming a opening (e.g., by mechanical drilling or laser drilling) in member 78 and forming a conductive coating or a conductive filler material (e.g., conductive paste, conductive adhesive, conductive foam, or other suitable conductive material) within the opening. However, this is merely illustrative. If desired, member 78 may be formed from additional layers of flexible printed circuit material (e.g., polyimide) or additional layers of rigid printed circuit material (e.g., glass infused epoxy).

As examples, member 78 may be formed from a portion of printed circuit board 74 that extends beyond encapsulation layer 56 under TFT layer 70 and includes additional layers of printed circuit board material, member 78 may be a portion of flexible printed circuit 76 having additional layers of flexible printed circuit material or member 78 and flexible printed circuit 76 may be formed from a common printed circuit having rigid and flexible portions (e.g., flexible circuit 76 may be a flex tail that extends from a layer of flexible printed circuit material in a rigid printed circuit that forms member 78).

If desired, printed circuit 74 may be coupled to via 80 of member 78 without using an interposed flexible printed circuit. Printed circuit 74 may extend under member 78 so that conductive contact 90 couples via 80 to a conductive contact on a surface of printed circuit 74.

Figure 7:
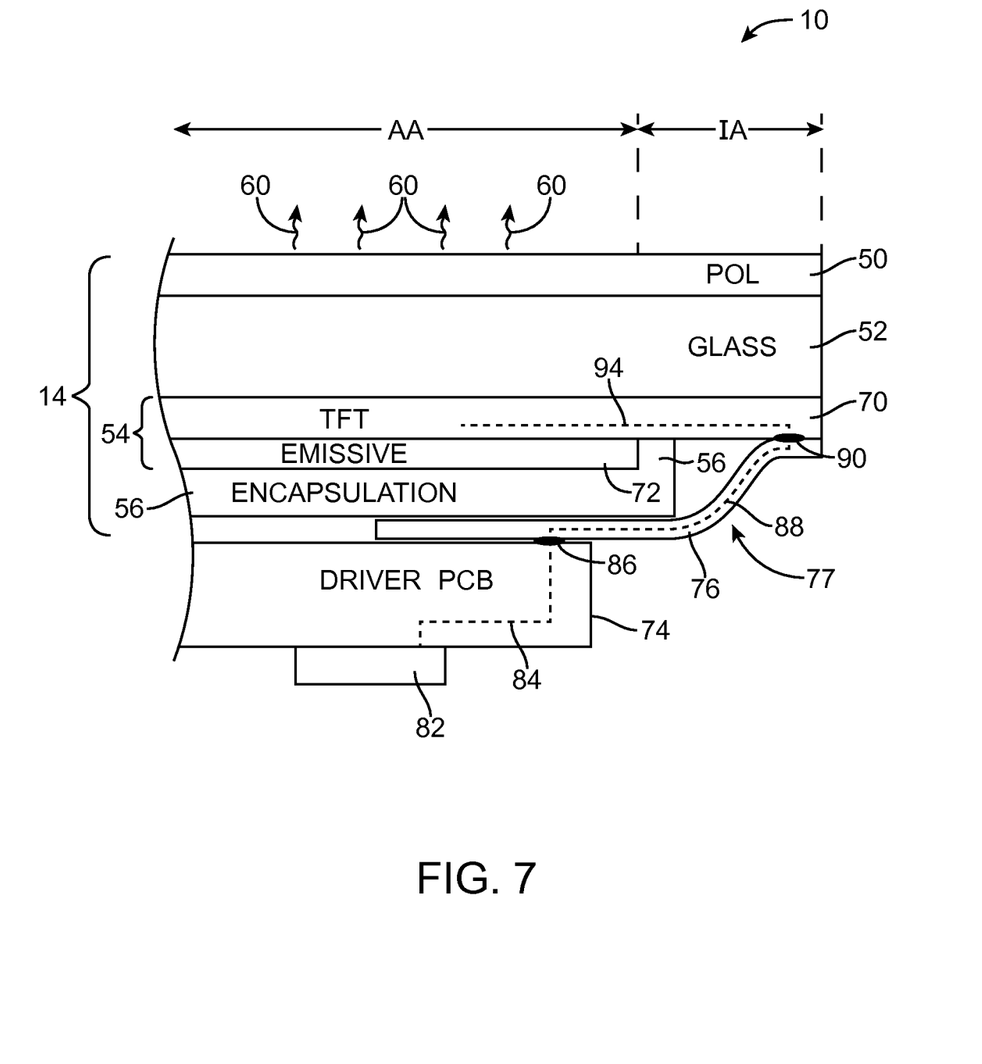
FIG. 7 is a cross-sectional side view of a portion of an illustrative display having an organic light-emitting diode array and a bent flexible circuit substrate in accordance with an embodiment of the present invention.

FIG. 7 is a cross-sectional side view of a bottom-emissive organic light-emitting diode display of the type shown in FIG. 5A showing how the size of inactive area IA may be minimized by forming control circuitry for the display behind a portion of the display without using a gap-filling member. As shown in FIG. 7, flexible printed circuit 76 may be used as a coupling structure by providing flexible printed circuit 76 with a bent portion such as curved portion 77 that carries traces 88 in flexible circuit 76 from contact 86 to contact 90. Flexible printed circuit 76 may be coupled to traces 94 using conductive material 90.

Figure 8:
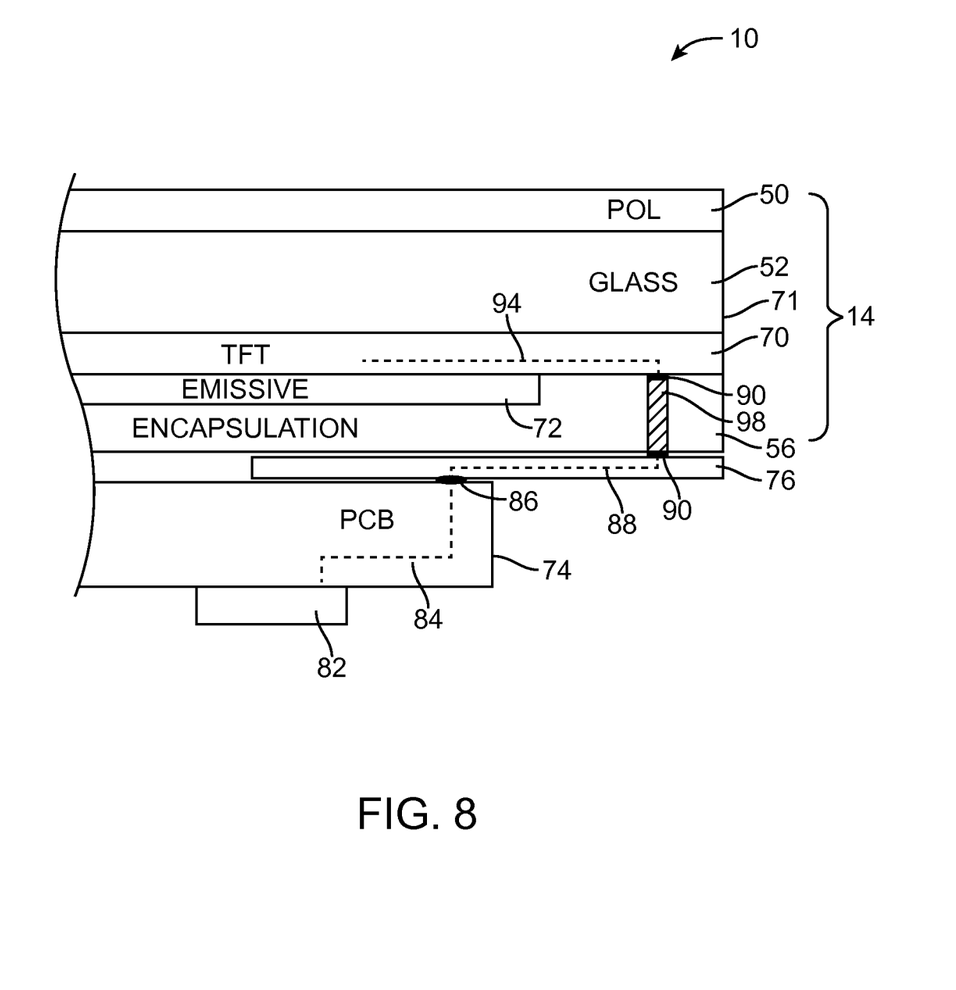
FIG. 8 is a cross-sectional side view of a portion of an illustrative display having an organic light-emitting diode array and an extended encapsulation layer with a conductive via in accordance with an embodiment of the present invention.

FIG. 8 is a cross-sectional side view of a bottom-emissive organic light-emitting diode display of the type shown in FIG. 5A showing how the size of inactive area IA may be minimized by forming control circuitry for the display behind a portion of the display using a conductive via formed in the encapsulation layer. As shown in FIG. 8, encapsulation layer 56 may extend substantially to edge 71 of display 14 and may include a conductive via such as via 98 formed through the encapsulation layer. Conductive via 98 may be connected between traces 94 of TFT layer 70 and traces 88 of flexible printed circuit 76 using, for example, conductive coupling material 90 (e.g., anisotropic conductive adhesive, solder or other suitable conductive material).

Via 98 may be formed in encapsulation layer 56 by forming a opening (e.g., by mechanical drilling, laser drilling, wet or dry etching, or other suitable processes) in encapsulation layer 56 and forming a conductive coating or a conductive filler material such as conductive paste within the opening.

Providing an organic light-emitting diode display such as display 14 with control circuitry that is formed behind the display so that one or more display layers (e.g., encapsulation layer 56 and/or emissive layer 72) is interposed between the thin-film transistors and the control circuitry as described above in connection with FIGS. 6, 7, and 8 (as examples) may help reduce or eliminate inactive area IA along one or more peripheral portions of the display.

Figure 9:
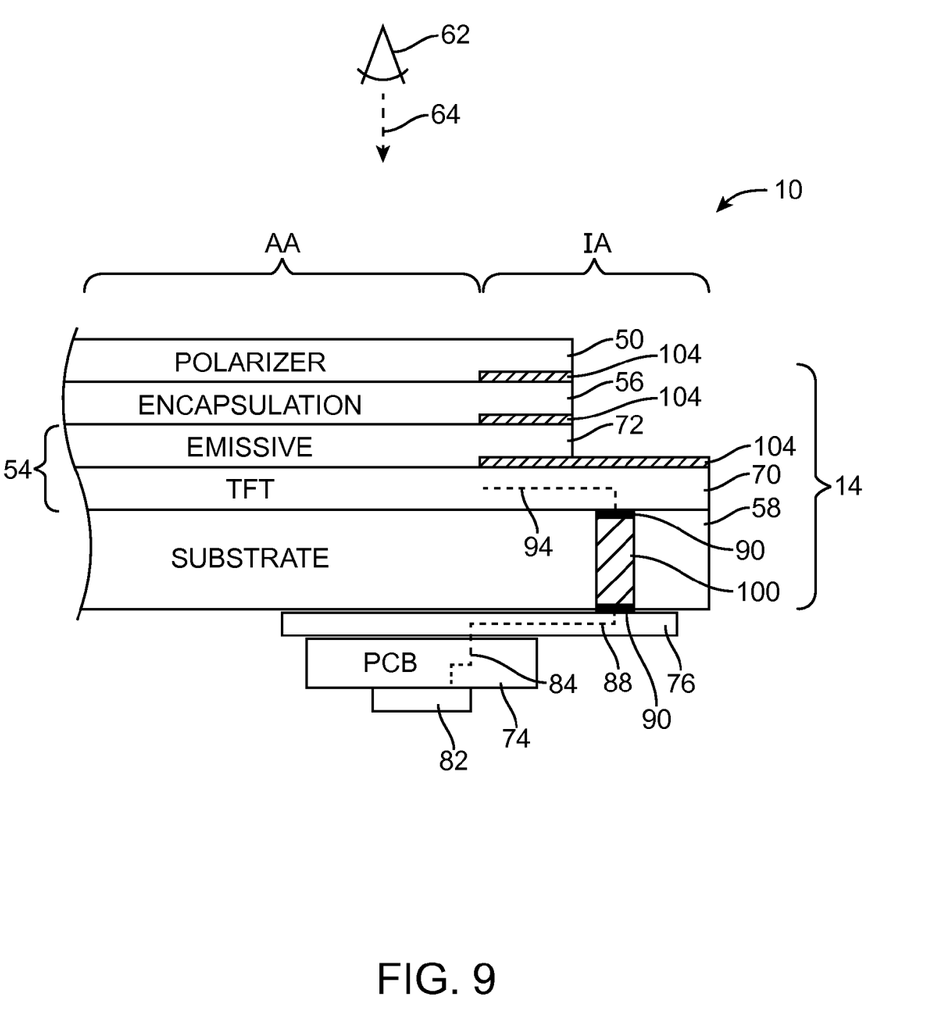
FIG. 9 is a cross-sectional side view of a portion of an illustrative display having an organic light-emitting diode array and an opaque mask showing various display layers on which the opaque mask may be formed in accordance with an embodiment of the present invention.

In configurations in which organic light-emitting diode display 14 includes an inactive area IA, portions of the display in the inactive area may be provided with an opaque masking material in the inactive area. The opaque masking material may be configured to block portions of the device in the inactive region of the display from being seen by a viewer such as viewer 62 viewing display 14 in direction 64 as shown in FIG. 9. FIG. 9 is a cross-sectional side view of a top-emissive organic light-emitting diode display of the type shown in FIG. 5B showing various locations within an OLED display where opaque masking material 104 may be formed.

Opaque masking material 104 may be formed from an opaque metal such as chrome oxide (sometimes referred to as black chrome), a polymer material infused with an opaque dye or pigment (e.g., carbon black), opaque photo-patternable material (i.e., material that can be formed over glass 52 and selectively patterned using light), other suitably opaque or mostly opaque materials, or any combination of these materials.

As shown in FIG. 9, opaque masking material 104 may be formed on a portion of TFT layer 70. Opaque masking material that is formed on top of TFT layer 70 may be uncovered by other display materials or a portion of the opaque masking material may be covered by organic emissive layer 72 and/or encapsulation layer 56. However, this is merely illustrative. If desired, opaque masking material 104 may be formed between OLED layer 54 and encapsulation layer 56 or opaque masking material 104 may be formed between encapsulation layer 56 and upper polarizer layer 50. If desired, opaque masking material 104 may be formed at any or all of the locations shown in FIG. 9.

In configurations of the type shown in FIG. 9, opaque masking material 104 may be used to hide a conductive via such as via 100 formed in substrate 58 of display 14. As shown in FIG. 9, via 100 may be connected between signal paths 94 in TFT layer 70 and signal paths 88 in flexible printed circuit 76.

Via 100 may be formed in substrate 58 by drilling (e.g., laser drilling) an opening in substrate 58 and lining or filling the opening with conductive material. Conductive material 90 may be used to electrically couple signal lines in TFT layer 70 to signal lines in flexible printed circuit 76 through via 100. TFT layer 70 and via 100 may be formed on substrate 58 by forming thin-film transistors on a first surface of substrate 58, laser drilling an opening in substrate 58 and plating, lining, or filling the opening with conductive material.

If desired, display 14 of FIG. 9 may be coupled to printed circuit 74 without the use of flexible printed circuit 76 by forming signal lines (e.g., patterned conductive metal traces) along a back surface of substrate (i.e., a surface opposite to the surface on which TFT layer 70 is formed). These types of back-surface traces may be used to couple via 100 to printed circuit 74.

If desired, a layer of touch-sensitive circuitry (e.g., an array of capacitive touch sensor electrodes, a resistive touch array, touch sensor structures based on acoustic touch, optical touch, force-based touch technologies, or other suitable touch sensor components) may be formed on an upper surface of encapsulation layer 56 (e.g., between encapsulation layer 56 and polarization layer 50). However, this is merely illustrative. If desired, touch-sensitive circuitry for display 14 may be formed on polarizer layer 50 or may be formed separately from display layers 50, 56, 54, and 58. As an example, touch-sensitive circuitry for display 14 may be formed on an outer cover layer as shown in FIG. 10.

Figure 10:
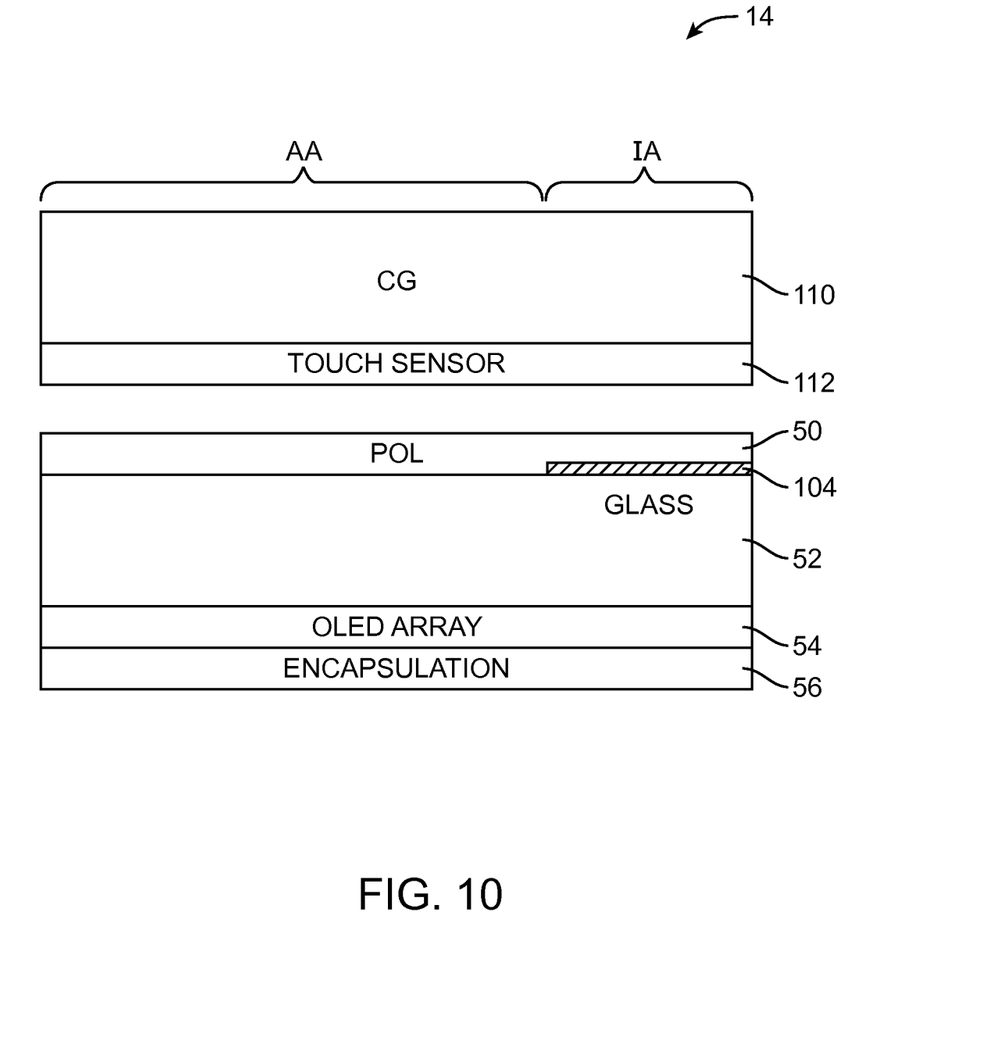
FIG. 10 is a cross-sectional side view of a portion of an illustrative display having an organic light-emitting diode array and an opaque mask formed on a glass layer of the display in accordance with an embodiment of the present invention.

FIG. 10 is a cross-sectional side view of a bottom-emissive organic light-emitting diode display of the type shown in FIG. 5A having a layer of opaque masking material. As shown in FIG. 10, display 14 may be optionally provided with a cover layer such as cover layer 110. Cover layer 110 may be formed from glass, plastic, or other suitable transparent material. Cover layer 110 may be rigid or flexible and may sometimes be referred to as a cover glass (CG) layer. Touch-sensor circuitry 112 may be formed on an inner layer of cover layer 110. However, this is merely illustrative. If desired, touch-sensor circuitry 112 may be formed on polarizer layer 50, between polarizer layer 50 and glass layer 52 or may be formed as a separate layer of display 14.

Opaque masking material 104 may be formed between a portion of glass layer 52 and a corresponding portion of upper (circular) polarizer 50 in inactive region IA of display 14. During manufacturing of display 14, opaque masking material 104 may be applied to a top (outer) surface of glass 52 and patterned (e.g., photo-patterned) or may be painted or otherwise applied to glass 52.

In some configurations, opaque masking material 104 may be formed from a material (e.g., black chrome) that can withstand relatively high temperatures associated with display assembly processes such as thin-film-transistor polysilicon deposition processes that may be used in formatting of OLED array 54 on glass 52. In configurations which opaque masking material 104 is formed from this type of high temperature material, opaque masking material may be formed on a bottom side of glass layer 52 (i.e., interposed between a portion of OLED array 54 and glass layer 52).

The foregoing is merely illustrative of the principles of this invention and various modifications can be made by those skilled in the art without departing from the scope and spirit of the invention.

What is claimed is:

1. A display, comprising:
    a light-emitting diode layer having opposing first and second surfaces;
    an encapsulation layer formed on the first surface;
    a substrate layer formed on the second surface; and
    a conductive via formed in the encapsulation layer that couples the light-emitting diode layer to control circuitry for the display.

2. The display defined in claim 1, wherein the light-emitting diode layer comprises a thin-film transistor layer and a layer of light-emitting material.

3. The display defined in claim 2, wherein the thin-film transistor layer is at least partially interposed between the layer of light-emitting material and the substrate.

4. The display defined in claim 2, wherein the layer of light-emitting material is interposed between the encapsulation layer and the thin-film transistor layer.

5. The display defined in claim 2, wherein the conductive via couples the thin-film transistor layer to the control circuitry for the display.

6. The display defined in claim 5, wherein a portion of the encapsulation layer is formed directly on a portion of thin-film transistor layer.

7. The display defined in claim 6, wherein the conductive via extends from the control circuitry to the portion of the thin-film transistor layer on which the encapsulation layer is directly formed.

8. An electronic device, comprising:
    a light-emitting diode display that includes a thin-film transistor layer;
    control circuitry configured to generate control signals for operating the light-emitting diode display, wherein the light-emitting diode display includes an encapsulation layer at least partially interposed between the thin-film transistor layer and the control circuitry; and
    a conductive via that extends through the encapsulation layer to couple the thin-film transistor layer to the control circuitry.

9. The electronic device defined in claim 8, wherein the light-emitting diode layer further includes a layer of light-emitting material interposed between the encapsulation layer and the thin-film transistor layer.

10. The electronic device defined in claim 9, wherein the thin-film transistor layer comprises a first portion on which the layer of light-emitting material is formed and a second portion on which the encapsulation layer is formed.

11. The electronic device defined in claim 10, wherein the conductive via extends from the second portion of the thin-film transistor layer to the control circuitry.

12. The electronic device defined in claim 8, further comprising:
    a substrate having first and second opposing surfaces, wherein the thin-film transistor layer is formed on the first surface, and wherein a polarizer layer is formed on the second surface.

13. The electronic device defined in claim 8, wherein the conductive via is coupled to the thin-film transistor layer using an anisotropic conductive adhesive.

14. The electronic device defined in claim 8, wherein the control circuitry comprises a printed circuit board and a flexible printed circuit attached to the printed circuit board.

15. The electronic device defined in claim 14, wherein the conductive via is attached to the flexible printed circuit using an anisotropic conductive adhesive.

16. A display, comprising:
a transparent substrate layer;
a light-emitting diode layer formed on the transparent substrate layer;
a polarizer layer formed over the light-emitting diode layer; and
opaque masking material formed between at least a portion of the light-emitting diode layer and the polarizer layer.

17. The display defined in claim 16, wherein the light-emitting diode layer comprises a thin-film transistor layer and a layer of light-emitting material on the thin-film transistor layer, and wherein the opaque masking material is at least partially interposed between the layer of light-emitting material and the thin-film transistor layer.

18. The display defined in claim 16 further comprising:
an encapsulation layer interposed between the light-emitting diode layer and the polarizer layer, wherein the opaque masking material is interposed between the encapsulation layer and the light-emitting diode layer.

19. The display defined in claim 18, wherein the light-emitting diode layer comprises a thin-film transistor layer and a layer of light-emitting material formed on the thin-film transistor layer, and wherein the opaque masking material is interposed between the encapsulation layer and the layer of light-emitting material.

20. The display defined in claim 16 further comprising:
an encapsulation layer interposed between the light-emitting diode layer and the polarizer layer, wherein the opaque masking material is interposed between the encapsulation layer and the polarizer layer.

* * * * *